United States Patent
Nakajima et al.

(10) Patent No.: US 8,962,405 B2
(45) Date of Patent: Feb. 24, 2015

(54) METHOD OF MANUFACTURING SEMICONDUCTOR DEVICE BY MOUNTING AND POSITIONING A SEMICONDUCTOR DIE USING DETECTION MARKS

(71) Applicant: Fuji Electric Co., Ltd., Kawasaki (JP)

(72) Inventors: Tsunehiro Nakajima, Matsumoto (JP); Haruo Nakazawa, Matsumoto (JP)

(73) Assignee: Fuji Electric Co., Ltd. (JP)

(*) Notice: Subject to any disclaimer, the term of this patent is extended or adjusted under 35 U.S.C. 154(b) by 0 days.

(21) Appl. No.: 13/798,589

(22) Filed: Mar. 13, 2013

(65) Prior Publication Data

US 2013/0196457 A1 Aug. 1, 2013

Related U.S. Application Data

(63) Continuation of application No. PCT/JP2010/067169, filed on Sep. 30, 2010.

(51) Int. Cl.
  *H01L 21/00* (2006.01)
  *H01L 21/84* (2006.01)
  (Continued)

(52) U.S. Cl.
  CPC ............. *H01L 22/12* (2013.01); *G03F 9/7084* (2013.01); *H01L 29/0615* (2013.01); *H01L 29/0661* (2013.01); *H01L 29/66333* (2013.01); *H01L 29/7395* (2013.01); *G03F 9/7088* (2013.01);
  (Continued)

(58) Field of Classification Search
  USPC ......... 438/142, 145, 157, 160, 149, 133, 135; 356/614, 615, 620
  See application file for complete search history.

(56) References Cited

U.S. PATENT DOCUMENTS 5,141,889 A * 8/1992 Terry et al. .................... 438/138
6,151,102 A   11/2000 Nishi
(Continued)

FOREIGN PATENT DOCUMENTS

JP   9-283426 A    10/1997
JP   2002-260527 A  9/2002
(Continued)

OTHER PUBLICATIONS

ISR issued Dec. 28, 2010 for PCT/JP2010/067169.
(Continued)

*Primary Examiner* — Charles Garber
*Assistant Examiner* — Brigitte Paterson
(74) *Attorney, Agent, or Firm* — Rossi, Kimms & McDowell LLP (57) ABSTRACT

In some aspects of the invention, a circuit pattern of a front surface structure is formed in a front surface of a semiconductor wafer and an alignment mark is formed on the front surface of a semiconductor wafer. A transparent supporting substrate is attached to the front surface of the semiconductor wafer by a transparent adhesive. Then, a resist is applied onto a rear surface of the semiconductor wafer. Then, the semiconductor wafer is mounted on a stage of an exposure apparatus, with the supporting substrate down. Then, the alignment mark formed on the front surface of the semiconductor wafer is recognized by a camera, and the positions of the semiconductor wafer and a photomask are aligned with each other. Then, the resist is patterned. Then, a circuit pattern is formed in the rear surface of the semiconductor wafer.

13 Claims, 10 Drawing Sheets

(51) Int. Cl.
*H01L 21/66* (2006.01)
*G03F 9/00* (2006.01)
*H01L 29/06* (2006.01)
*H01L 29/66* (2006.01)
*H01L 29/739* (2006.01)
*H01L 21/683* (2006.01)
*H01L 23/544* (2006.01)
*H01L 21/266* (2006.01)

(52) U.S. Cl.
CPC .......... *H01L 21/6835* (2013.01); *H01L 23/544* (2013.01); *H01L 21/6836* (2013.01); *H01L 2221/68327* (2013.01); *H01L 2221/6834* (2013.01); *H01L 2221/68368* (2013.01); *H01L 2221/68372* (2013.01); *H01L 2221/68381* (2013.01); *H01L 2221/68386* (2013.01); *H01L 21/266* (2013.01); *H01L 2223/54426* (2013.01); *H01L 2223/54453* (2013.01); *H01L 2221/68318* (2013.01); *H01L 2223/5446* (2013.01); *H01L 2924/0002* (2013.01)
USPC .............. 438/160; 438/14; 438/145; 438/157

(56) References Cited

U.S. PATENT DOCUMENTS

| 2004/0048419 | A1 | 3/2004 | Kitamura et al. | |
|---|---|---|---|---|
| 2005/0032283 | A1* | 2/2005 | Itoga et al. | 438/149 |
| 2005/0196939 | A1 | 9/2005 | Lee et al. | |
| 2006/0261446 | A1* | 11/2006 | Wood et al. | 257/621 |
| 2007/0000595 | A1 | 1/2007 | Prack | |
| 2007/0004171 | A1 | 1/2007 | Arana et al. | |
| 2007/0020887 | A1* | 1/2007 | Sekiya | 438/459 |
| 2008/0192181 | A1* | 8/2008 | Nakamura et al. | 349/96 |
| 2009/0001504 | A1* | 1/2009 | Takei et al. | 257/507 |
| 2009/0218678 | A1* | 9/2009 | Kawabata et al. | 257/698 |
| 2010/0289059 | A1* | 11/2010 | Hsieh | 257/140 |

FOREIGN PATENT DOCUMENTS

| JP | 2004-165403 A | 6/2004 |
|---|---|---|
| JP | 2005-056917 A | 3/2005 |
| JP | 2005-129653 A | 5/2005 |
| JP | 2005-268238 A | 9/2005 |
| JP | 2006-019556 A | 1/2006 |
| JP | 2009-188148 A | 8/2009 |
| WO | 03/049164 A1 | 6/2003 |

OTHER PUBLICATIONS

Notification of Reasons for Refusal for corresponding JP 2012-536098, dated Oct. 8, 2013. Partial English translation provided.

Extended European Search Report for corresponding EP 10857866.7, mail date Mar. 5, 2014.

* cited by examiner

METHOD OF MANUFACTURING SEMICONDUCTOR DEVICE BY MOUNTING AND POSITIONING A SEMICONDUCTOR DIE USING DETECTION MARKS

CROSS-REFERENCE TO RELATED APPLICATION

This application is a continuation of International Application No. PCT/JP2010/067169, filed on Sep. 30, 2010. The disclosure of the PCT application in its entirety, including the drawings, claims, and the specification thereof, is incorporated herein by reference.

BACKGROUND

1. Technical Field

Embodiments of the invention relate to methods of manufacturing semiconductor devices.

2. Related Art

In recent years, a technique has been proposed which reduces the thickness of a semiconductor wafer to reduce energy loss or improve the radiation performance in a power device, such as an IGBT (Insulated Gate Bipolar Transistor). However, for example, when the thickness of the semiconductor wafer with a diameter of 6 inches is reduced to about 80 μm, the semiconductor wafer can be broken or cracked. In order to solve the problems, a handling technique has been proposed which adjusts the deposition conditions of a metal thin film formed on the surface of the semiconductor wafer or is used in a semiconductor wafer manufacturing facility.

To increase the diameter of the semiconductor wafer to, for example, 8 inches or further reduce the thickness of the semiconductor wafer, the following techniques have been proposed: a TAIKO (registered trademark) technique in which the outer circumferential end of the rear surface of the semiconductor wafer remains as a reinforcing portion (rib portion) and the thickness of a central portion is reduced; and a WSS (Wafer Support System) technique which reinforces an integrated circuit or a MEMS (Micro Electro Mechanical Systems) with other members in order to reduce the thickness thereof.

Figure 7:
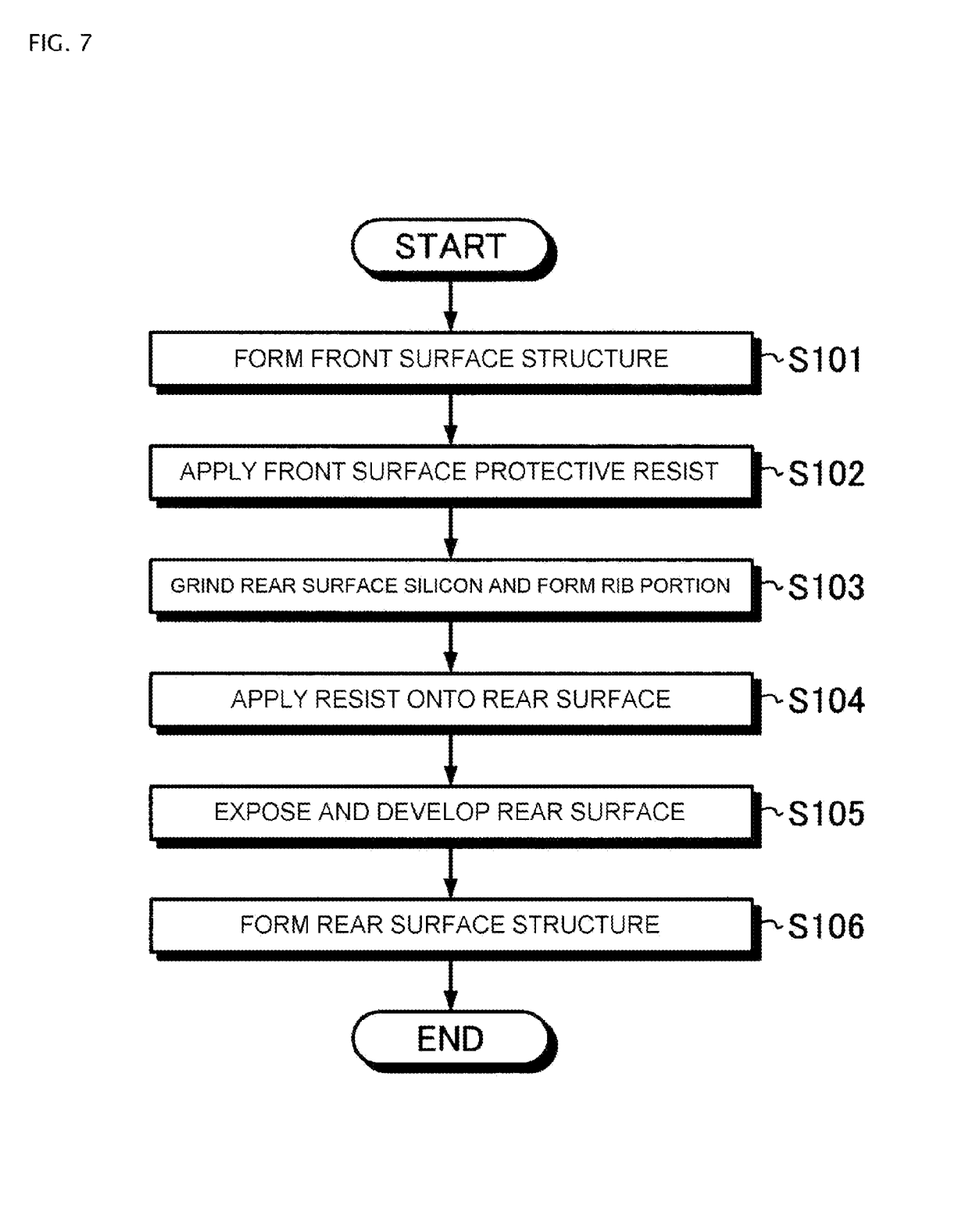
FIG. 7 is a flowchart illustrating a method of manufacturing a semiconductor device according to the related art.
Figure 8:
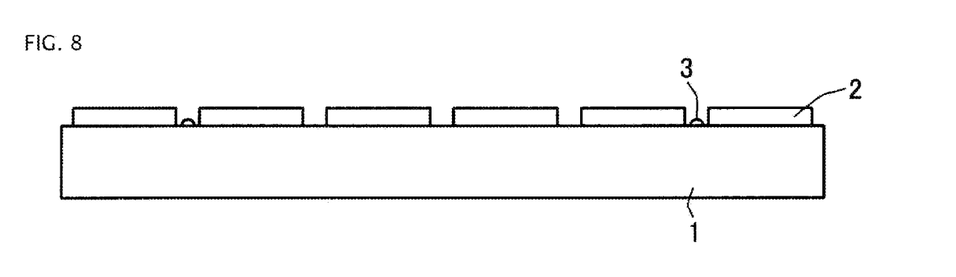
FIG. 8 is a diagram sequentially illustrating the method of manufacturing the semiconductor device according to the related art;.

A method of manufacturing a semiconductor device using the TAIKO technique will be described (hereinafter, referred to as "Conventional example 1"). FIG. 7 is a flowchart illustrating a method of manufacturing a semiconductor device according to the related art. FIGS. 8 to 11 are diagrams sequentially illustrating the method of manufacturing the semiconductor device according to the related art. First, a front surface structure 2 is formed on the front surface of a semiconductor wafer 1 (Step S101 and FIG. 8). In this case, marks (alignment marks) 3 for aligning the position of the semiconductor wafer 1 in the horizontal direction with the position of a photomask are formed on the front surface of the semiconductor wafer 1.

Figure 9:
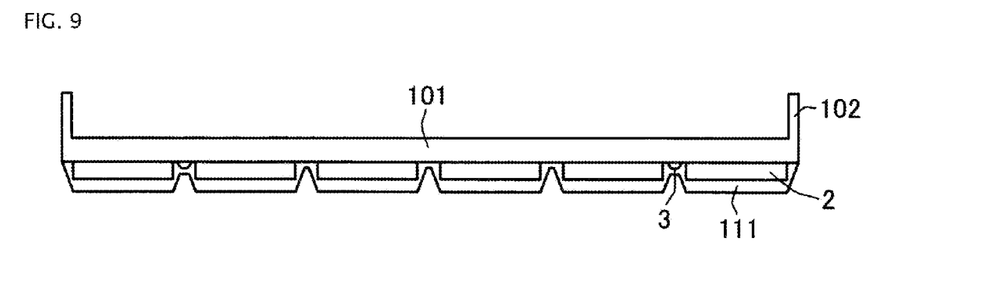
FIG. 9 is a diagram sequentially illustrating the method of manufacturing the semiconductor device according to the related art.

Then, a resist (hereinafter, referred to as a "front surface protective resist") 111 which protects the front surface structure 2 is applied onto the front surface of the semiconductor wafer 1 (Step S102 and FIG. 9). Then, the outer circumferential end of the rear surface of the semiconductor wafer 1 remains as a reinforcing portion (rib portion) 102 and only a central portion of the semiconductor wafer 1 is grounded to be thinned. In this way, a wafer (hereinafter, referred to as a "rib wafer") 101 in which a concave portion is provided in the rear surface of the semiconductor wafer 1 is manufactured (Step S103 and FIG. 9). Then, a resist (hereinafter, referred to as a "rear surface resist") 113 is applied onto the rear surface of the rib wafer 101 (Step S104 and FIG. 10).

Then, a circuit pattern is formed in the rear surface resist 113. In the patterning process, first, the position of a camera 22 which is provided below a stage 21 of an exposure apparatus is aligned with the position of a photomask 24 which is provided above the stage 21. Then, the rib wafer 101 is mounted on the stage 21 of the exposure apparatus, with the front surface down (FIG. 11).

Then, the alignment mark 3 formed on the front surface of the rib wafer 101 is recognized by the camera 22 from the lower side of the stage 21 and the positions of the camera 22 and the rib wafer 101 are aligned with each other. In this way, the positions of the rib wafer 101 and the photomask 24 are accurately aligned with each other. Openings 23 are provided in the stage 21 at positions corresponding to the alignment marks 3 which are formed on the front surface of the rib wafer 101. Therefore, the camera 22 observes the rib wafer 101 through the opening 23 of the stage 21.

Figure 11:
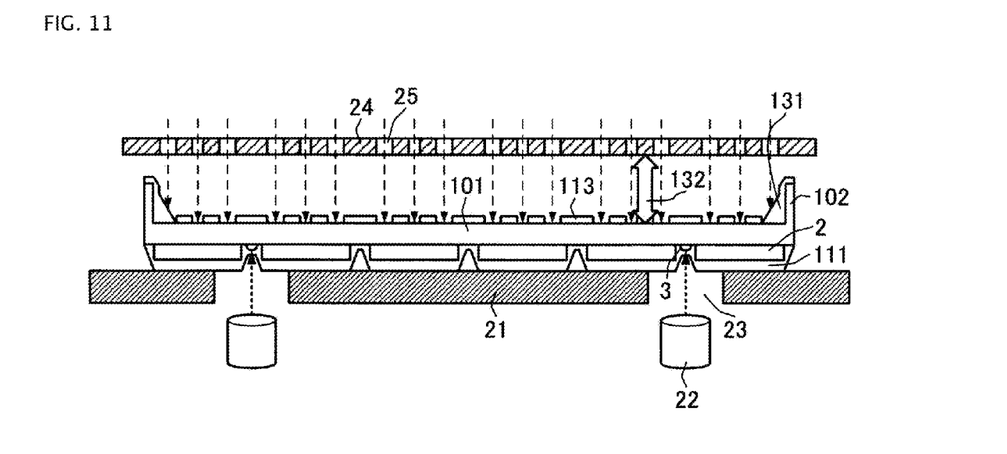
FIG. 11 is a diagram sequentially illustrating the method of manufacturing the semiconductor device according to the related art.

Then, exposure and development are performed to transfer the mask pattern of the photomask 24 to the rear surface resist 113 (Step S105 and FIG. 11). Openings 25 corresponding to the circuit pattern of a rear surface structure of the rib wafer 101 are formed in the photomask 24. Then, the rear surface resist 113 is baked and the patterning process ends.

Then, ion implantation and thermal diffusion are performed using the rear surface resist 113 as a mask to form the rear surface structure (not illustrated) on the rear surface of the rib wafer 101 (Step S106). Then, the rear surface resist 113 is removed. Then, the rib wafer 101 is diced into chips and a dicing tape peels off. In this way, a semiconductor device is completed.

Figure 12:
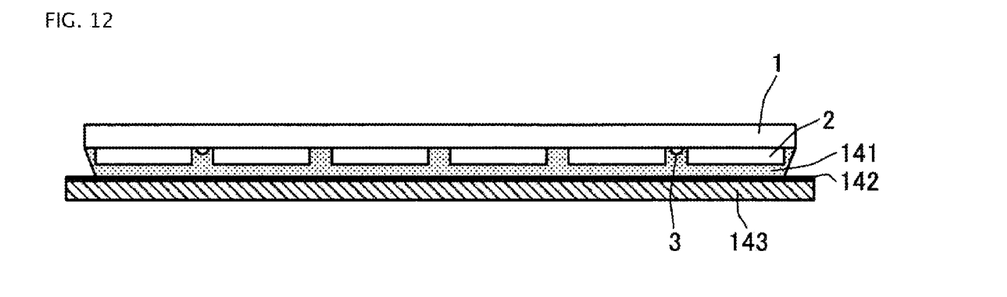
FIG. 12 is a diagram sequentially illustrating another example of the method of manufacturing the semiconductor device according to the related art.
Figure 13:
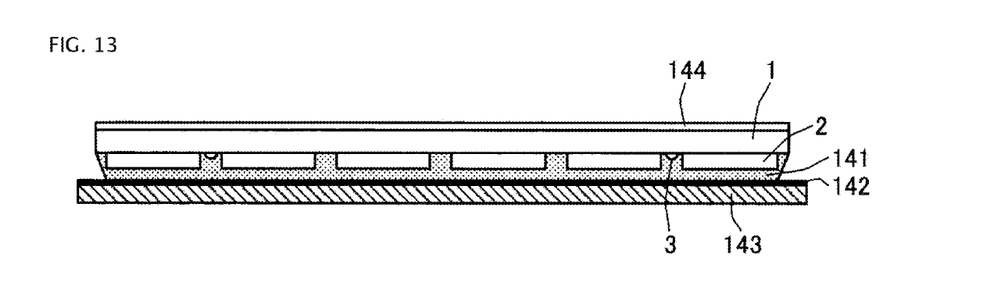
FIG. 13 is a diagram sequentially illustrating another example of the method of manufacturing the semiconductor device according to the related art.
Figure 14:
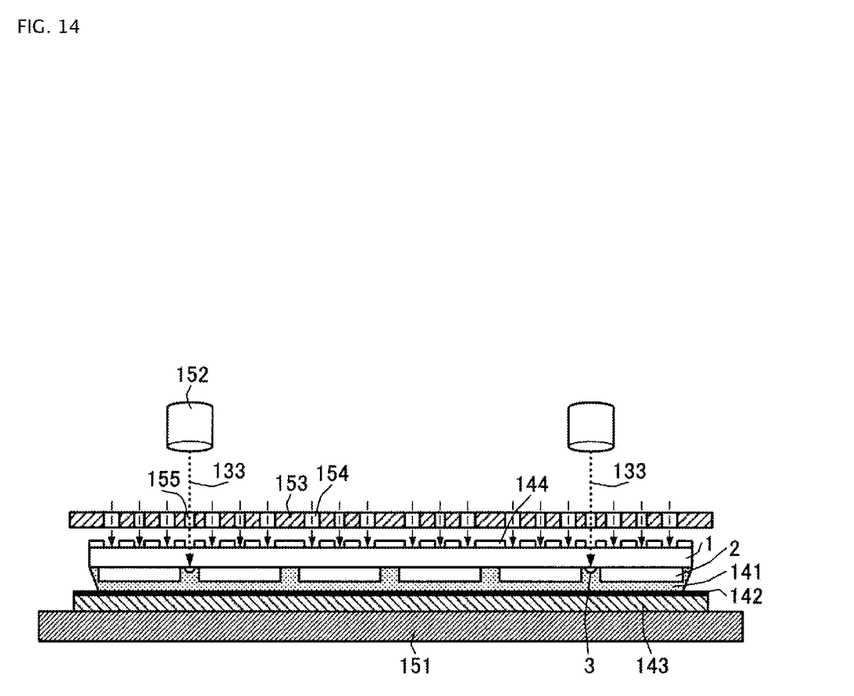
FIG. 14 is a diagram sequentially illustrating another example of the method of manufacturing the semiconductor device according to the related art.

Next, a method of manufacturing a semiconductor device using the WSS technique will be described (hereinafter, referred to as "Conventional example 2"). FIGS. 12 to 14 are diagrams sequentially illustrating another example of the method of manufacturing the semiconductor device according to the related art. First, Step S101 is performed, similarly to Conventional example 1 (see FIGS. 7 and 8). Then, a supporting substrate 143 is attached to the front surface of a semiconductor wafer 1 by, for example, an ultraviolet (UV)-curable adhesive 141 (FIG. 12). A black layer 142 which is made of a material absorbing laser light is coated on a surface of the supporting substrate 143 which is bonded by the adhesive 141 in order to facilitate the peeling of the supporting substrate from the semiconductor wafer 1.

Then, the entire rear surface of the semiconductor wafer 1 is ground to reduce the thickness of the semiconductor wafer 1 (FIG. 12). Then, a resist (hereinafter, referred to as a rear surface resist) 144 is applied onto the rear surface of the semiconductor wafer 1 (FIG. 13). Then, a circuit pattern is formed in the rear surface resist 144 (FIG. 14). In the patterning process, first, the position of an infrared camera 152 which is provided above a stage 151 of an exposure apparatus is aligned with the position of a photomask 153 which is provided between the stage 151 and the infrared camera 152. Then, the semiconductor wafer 1 is mounted on the stage 151 of the exposure apparatus, with the front surface down.

Then, alignment mark 3 which is formed on the front surface of the semiconductor wafer 1 is recognized by the infrared camera 152 through the semiconductor wafer 1 from the upper side of the photomask 153 and the positions of the infrared camera 152 and the semiconductor wafer 1 are aligned with each other. In this way, the positions of the infrared camera 152 and the semiconductor wafer 1 are aligned with each other and the positions of the semiconductor wafer 1 and the photomask 153 are accurately aligned with each other.

Openings 154 which correspond to the circuit pattern of a rear surface structure of the semiconductor wafer 1 are formed in the photomask 153. In addition, openings 155 are formed in the photomask 153 at positions corresponding to the alignment marks 3 which are formed on the front surface of the semiconductor wafer 1. Therefore, the infrared camera 152 emits laser light to the semiconductor wafer 1 through the opening 155 of the photomask 153 and observes the semiconductor wafer 1.

Then, exposure and development are performed to transfer the mask pattern of the photomask 153 to the rear surface resist 144 (FIG. 14). Then, the rear surface resist 144 is baked and the patterning process ends. Then, similarly to Conventional example 1, ion implantation and thermal diffusion are performed using the rear surface resist 144 as a mask to form the rear surface structure (not illustrated) on the rear surface of the semiconductor wafer 1. Then, the rear surface resist 144 is removed.

Then, for example, a dicing tape is attached to the rear surface of the semiconductor wafer 1. Then, laser light is emitted from the front surface of the semiconductor wafer 1 to sublimate the adhesive 141 and the supporting substrate 143 peels off from the semiconductor wafer 1. Then, the semiconductor wafer 1 is diced into chips and the dicing tape peels off. In this way, a semiconductor device is completed.

As such, as a method of attaching the semiconductor wafer to, for example, the dicing tape after the supporting substrate is attached to the semiconductor wafer, the following method has been proposed: the surface of the semiconductor wafer is attached to a plate-shaped object supporting substrate, with an adhesive tape having an adhesive layer whose adhesion is reduced by an external factor interposed therebetween; the rear surface of the semiconductor wafer is ground in this state; a dicing tape is attached to the ground rear surface of the semiconductor wafer; the outer circumference of the dicing tape is supported by a dicing frame; an external factor is applied to the adhesive layer to reduce the adhesion of the adhesive layer, thereby detaching the plate-shaped object supporting substrate from the adhesive tape without damaging the semiconductor wafer or the semiconductor chip. See, for example, Pamphlet of PCT International Publication No. WO03/049164 (also referred to herein as "Patent Literature 1").

Figure 10:
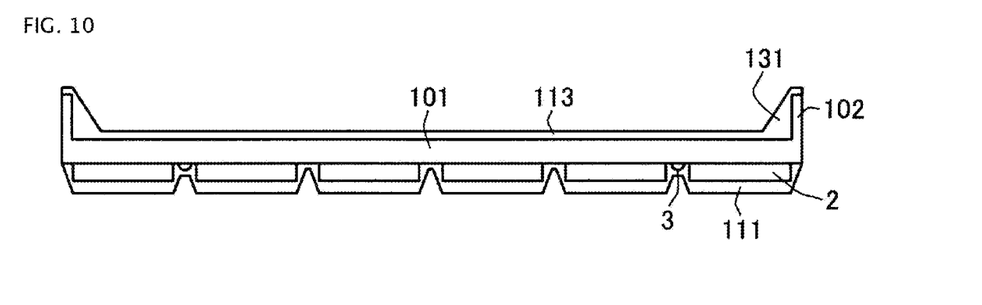
FIG. 10 is a diagram sequentially illustrating the method of manufacturing the semiconductor device according to the related art.

However, in Conventional example 1, since the concave portion is formed in the rear surface of the semiconductor wafer 1 by the rib portion 102, it is difficult to uniformly apply the rear surface resist 113. Therefore, as illustrated in FIG. 10, the thickness of a portion of the rear surface resist 113 in the vicinity of the rib portion 102 increases. In a thick portion 131 of the rear surface resist 113, the rear surface resist 113 cannot be completely dissolved by development. Therefore, as illustrated in FIG. 11, it is difficult to transfer the circuit pattern corresponding to the openings 25 of the photomask 24 to the rear surface resist 113.

Furthermore, in Conventional example 1, as illustrated in FIG. 11, a gap 132 between the rib wafer 101 and the photomask 24 needs to be more than the height of the rib portion 102. As the gap 132 increases, resolution is reduced or the accuracy of alignment is reduced. In addition, when the TAIKO technique described above is used to increase the diameter of the semiconductor wafer 1, there is a concern that a step portion between the rib portion 102 and the central portion of the rib wafer 101 will be broken or cracked.

Figure 15:
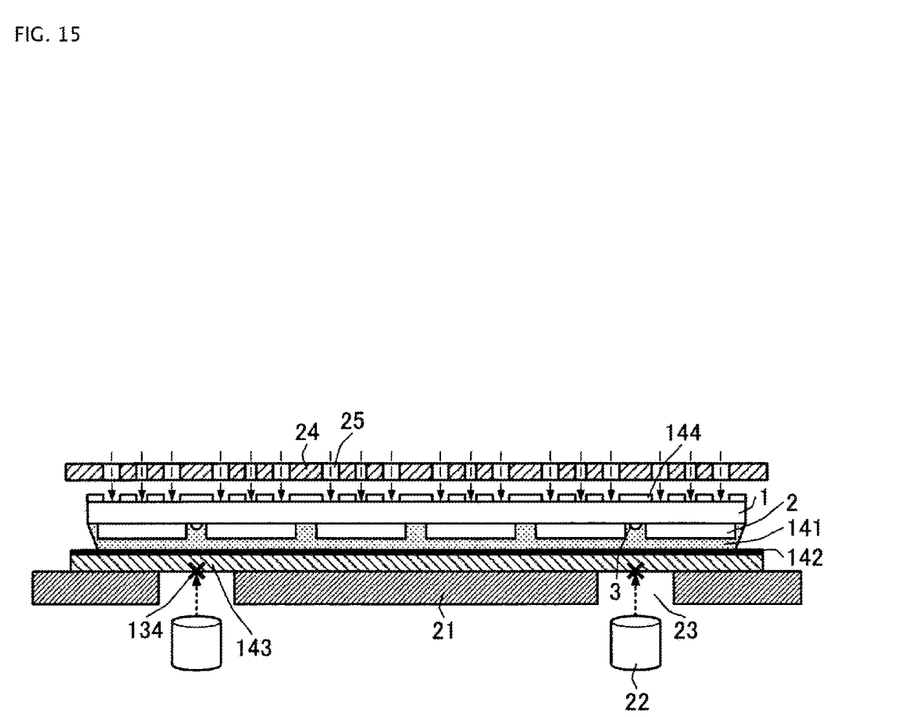
FIG. 15 is a diagram sequentially illustrating another example of the method of manufacturing the semiconductor device according to the related art.

FIG. 15 is a diagram sequentially illustrating another example of the method of manufacturing the semiconductor device according to the related art. FIG. 15 illustrates a case in which a supporting substrate is bonded to a semiconductor wafer 1 by the WSS technique (see Conventional example 2) and exposure and development are performed by a general exposure apparatus (see Conventional example 1) including a camera 22 which is provided below a stage 21. In the WSS technique according to Conventional example 2, for example, an opaque adhesive manufactured by T-MAT (registered trademark) and a supporting substrate which is made of a glass material or silicon (Si) and includes a black layer 142 manufactured by 3M Company (registered trademark) are used as an adhesive 141 and a supporting substrate 143, respectively. The adhesive 141 and the supporting substrate 143 are not transparent.

Therefore, as illustrated in FIG. 15, when the general exposure apparatus is used, the camera 22 which is provided below the stage 21 can observe only the surface 134 of the supporting substrate 143 through an opening 23 of the stage 21. That is, it is difficult to recognize an alignment mark 3 which is formed on the front surface of the semiconductor wafer 1 using the camera 22. Therefore, when the WSS technique is used, a special exposure apparatus using the infrared camera 152 is used as in Conventional example 2 (see FIG. 14). However, since the exposure apparatus is expensive, costs increase. In addition, the alignment mark 3 made of a material absorbing laser light needs to be formed on the front surface of the semiconductor wafer 1.

In addition, the openings 155 through which laser (infrared) light emitted from the infrared camera 152 passes need to be formed in the photomask 153. Therefore, when a positive resist is used as the rear surface resist 144, unnecessary patterning 133 is performed for the rear surface resist 144 due to the openings 155. In addition, since the infrared camera 152 recognizes the alignment mark 3 through an opaque member (semiconductor wafer 1), it is difficult to capture the clear image of the alignment mark 3 and the accuracy of alignment is reduced. Thus, as described above, there exists in the related art a need for an improved method of manufacturing a semiconductor device.

SUMMARY OF THE INVENTION

Embodiments of the invention address this and other needs. Embodiments of the invention address problems of the techniques according to the related art and provide methods of manufacturing a semiconductor device which are capable of improving the positioning accuracy of a semiconductor wafer. In addition, embodiments of the invention provide a method of manufacturing a semiconductor device which is capable of improving patterning accuracy. Furthermore, embodiments provide a method of manufacturing a semiconductor device which is capable of preventing the breaking or cracking of a semiconductor wafer, and a method of manufacturing a semiconductor device which is capable of reducing costs.

According to an aspect of the invention, there is provided a method of manufacturing a semiconductor device which performs patterning corresponding to a front surface shape of a semiconductor wafer for a rear surface of the semiconductor wafer. The method includes an attachment step of attaching a supporting substrate which has such transparency that a front surface of the semiconductor wafer is seen to the front surface of the semiconductor wafer using an adhesive which has such transparency that the front surface of the semiconductor wafer is seen.

According to an aspect of the invention, the method of manufacturing a semiconductor device may further include: a mounting step of mounting the semiconductor on a stage, with the supporting substrate down, after the attachment step; and a positioning step of detecting a mark which is formed on the front surface of the semiconductor wafer and positions the semiconductor wafer from a lower side of the stage and positioning the semiconductor wafer.

According to an aspect of the invention, in the positioning step, the mark which is formed on the front surface of the semiconductor wafer and positions the semiconductor wafer may be detected through the supporting substrate and the adhesive.

According to an aspect of the invention, in the positioning step, the mark which is formed on the front surface of the semiconductor wafer and positions the semiconductor wafer may be detected by the camera.

According to an aspect of the invention, in the positioning step, the camera may capture an image of the front surface of the semiconductor wafer through an opening which is provided in the stage from the lower side of the stage and the mark for positioning the semiconductor wafer may be detected on the basis of the image captured by the camera.

According to an aspect of the invention, after the positioning step, the patterning corresponding to the front surface shape of the semiconductor wafer may be performed for the rear surface of the semiconductor wafer.

According to an aspect of the invention, a semiconductor device according may further include: a first pattern forming step of forming a circuit pattern in the front surface of the semiconductor wafer before the attachment step; and a second pattern forming step of performing patterning corresponding to the circuit pattern of the front surface of the semiconductor wafer for the rear surface of the semiconductor wafer after the positioning step.

According to an aspect of the invention, a semiconductor device may further include a thinning step of grinding the rear surface of the semiconductor wafer to reduce the thickness of the semiconductor wafer after the attachment step and before the second pattern forming step.

According to an aspect of the invention, in the first pattern forming step, a circuit pattern of a front surface structure of an insulated gate bipolar transistor may be formed in the front surface of the semiconductor wafer which is a first conduction type. In the second pattern forming step, a second-conduction-type first semiconductor region and a first-conduction-type second semiconductor region may be selectively formed in a surface layer of the rear surface of the semiconductor wafer so as to be adjacent to each other.

According to an aspect of the invention, in the first pattern forming step, a circuit pattern of a front surface structure of an insulated gate bipolar transistor may be formed in the front surface of the semiconductor wafer. In the second pattern forming step, a concave portion may be formed at an outer circumferential end of the semiconductor wafer from the rear surface of the semiconductor wafer.

According to an aspect of the invention, the adhesive may have such transparency that the mark which is formed on the front surface of the semiconductor wafer and positions the semiconductor wafer is seen.

According to an aspect of the invention, the adhesive may be transparent.

According to an aspect of the invention, the thickness of the adhesive may be equal to or greater than 15 μm and equal to or less than 40 μm.

According to an aspect of the invention, the supporting substrate may have such transparency that the mark which is formed on the front surface of the semiconductor wafer and positions the semiconductor wafer is seen.

According to an aspect of the invention, the supporting substrate may be transparent.

According to an aspect of the invention, the thickness of the supporting substrate may be equal to or less than 5 mm.

According to an aspect of the invention, the thickness of the supporting substrate may be equal to or less than 1 mm.

According to certain embodiments, the supporting substrate can be attached to the front surface of the semiconductor wafer by the adhesive. In some embodiments, the adhesive and the supporting substrate can have such transparency that the front surface of the semiconductor wafer is seen. Therefore, the mark which is formed on the front surface of the semiconductor wafer, and positions the semiconductor wafer, can be accurately recognized from the lower side of the stage. In this way, it is possible to accurately perform patterning corresponding to the circuit pattern of the front surface structure of the semiconductor wafer for the rear surface of the semiconductor wafer.

In some embodiments, when the general exposure apparatus is used, it is possible to reinforce the thinned semiconductor wafer using the WSS technique. In addition, since the thinned semiconductor wafer can be reinforced by the supporting substrate, it is not necessary to form the rib portion at the outer circumferential end of the semiconductor wafer in order to reinforce the semiconductor wafer. Therefore, it is possible to solve the problems that a thick resist portion is formed in the vicinity of the rib portion, the gap between the semiconductor wafer and the photomask increases, and a step portion between the rib portion and the central portion is broken or cracked, when the rib portion is formed in the semiconductor wafer.

In addition, in some embodiments, because the general exposure apparatus can be used, it is not necessary to use a special exposure apparatus in which the infrared camera is provided above the stage (see, for example, Conventional example 2 and FIG. 14). Therefore, it is possible to reduce manufacturing costs, as compared to the related art.

Thus, by way of certain embodiments of the invention, it is possible to improve the accuracy of patterning, to improve the positioning accuracy of a semiconductor wafer, to prevent the breaking or cracking of the semiconductor wafer and/or to reduce manufacturing costs.

DETAILED DESCRIPTION

Hereinafter, methods of manufacturing a semiconductor device according to exemplary embodiments of the invention will be described in detail with reference to the accompanying drawings. In the specification and the accompanying drawings, in the layers or regions having "n" or "p" appended thereto, an electron or a hole is a major carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated.

(Embodiment)

Figure 1:
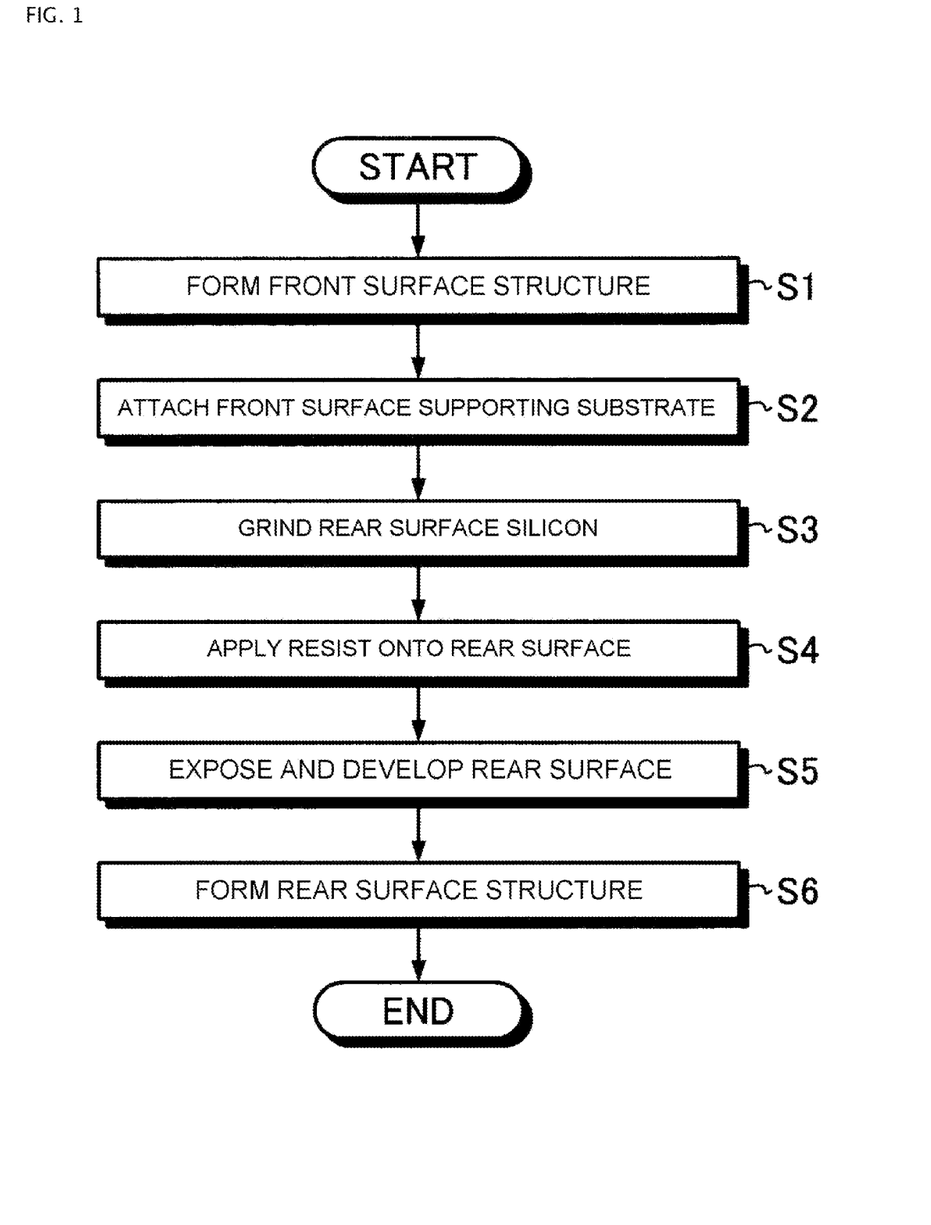
FIG. 1 is a flowchart illustrating a method of manufacturing a semiconductor device according to embodiments of the invention.
Figure 2:
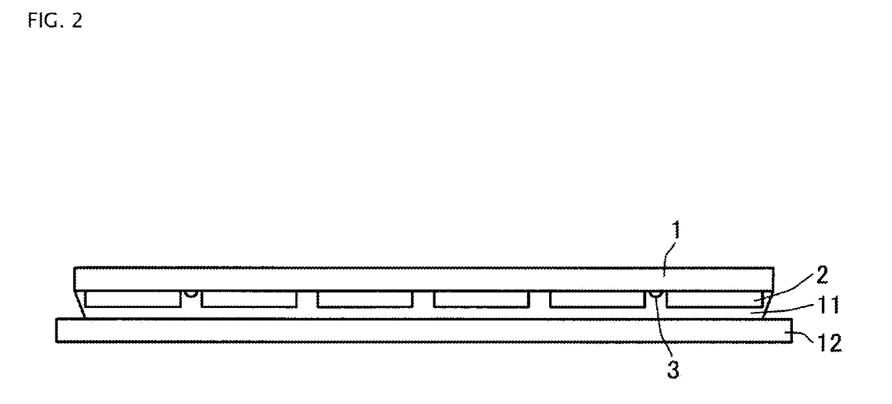
FIG. 2 is a diagram sequentially illustrating the method of manufacturing the semiconductor device according to the embodiments.
Figure 3:
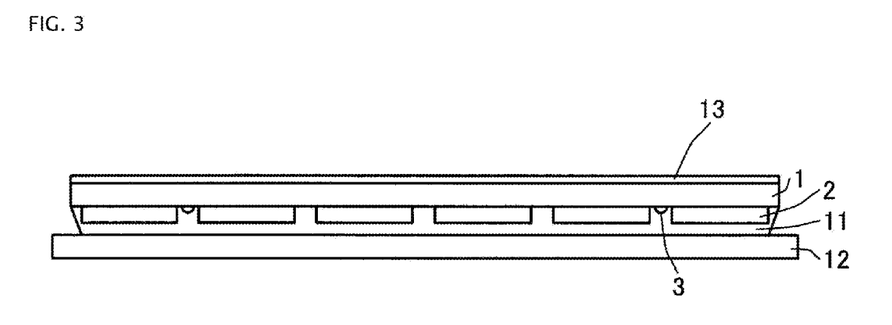
FIG. 3 is a diagram sequentially illustrating the method of manufacturing the semiconductor device according to the embodiments.
Figure 4:
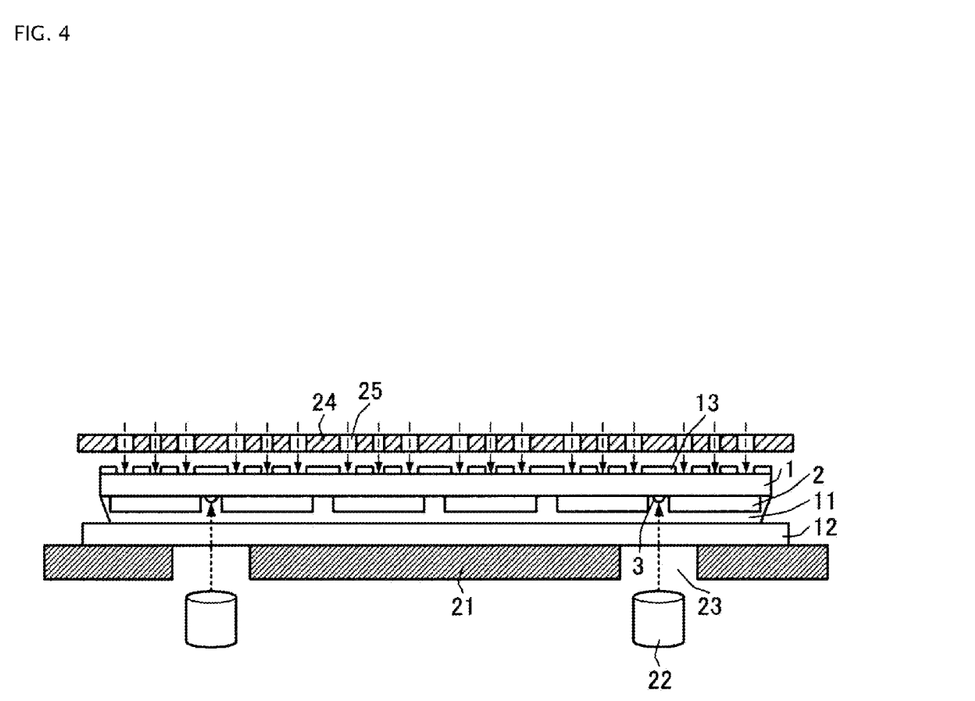
FIG. 4 is a diagram sequentially illustrating the method of manufacturing the semiconductor device according to the embodiments.

FIG. 1 is a flowchart illustrating a method of manufacturing a semiconductor device according to an embodiment. FIGS. 2 to 4 are diagrams sequentially illustrating the method of manufacturing the semiconductor device according to the embodiment. A method of manufacturing a semiconductor device will be described in which patterning corresponding to a front surface structure of a semiconductor wafer 1 is performed for the rear surface of the semiconductor wafer 1 to form circuit patterns in the front and rear surfaces.

First, ion implantation and thermal diffusion are performed to form the circuit pattern of a front surface structure 2 including, for example, a base region, an emitter region, a gate electrode, and an emitter electrode on the front surface of the semiconductor wafer 1 (Step S1 and FIG. 2: a first pattern forming process). In this case, at the same time as the circuit pattern of the front surface structure 2 is formed, marks (alignment marks) 3 for aligning the position of the semiconductor wafer 1 in the horizontal direction with the position of a photomask are formed on, for example, dicing lines. In this way, an uneven shape (surface shape) is formed in the front surface of the semiconductor wafer 1 by, for example, the surface structure including as the emitter electrode or the alignment marks 3.

Then, for example, a gel adhesive 11 is applied onto the front surface of the semiconductor wafer 1 by spin coating and is then hardened by heat. Then, a supporting substrate 12 is bonded to the adhesive 11. Here, a sheet-shaped adhesive 11 may be used. Then, the semiconductor wafer 1 and the supporting substrate 12 are pressed while being heated such that the semiconductor wafer 1 and the supporting substrate 12 are bonded to each other. In this way, the supporting substrate 12 is attached to the front surface of the semiconductor wafer 1 by the adhesive 11 (Step S2 and FIG. 2: an attachment process).

The adhesive 11 and the supporting substrate 12 used in the attachment process are such transparency that the front surface of the semiconductor wafer 1 is seen. That is, the adhesive 11 and the supporting substrate 12 are made of a material with high transmittance which transmits light and absorbs or diffuses a small amount of light. In addition, the supporting substrate 12 has sufficient hardness to maintain the flatness of the thinned semiconductor wafer 1. As used in this section, the term "light" means mainly visible light.

Specifically, the adhesive 11 and the supporting substrate 12 have such transparency that the front surface of the semiconductor wafer 1 is seen through the adhesive 11 and the supporting substrate 12 when the image of the semiconductor wafer 1 is captured by, for example, a camera (see FIG. 4) of an exposure apparatus from the side of the supporting substrate 12. In addition, the adhesive 11 and the supporting substrate 12 have such transparency that the front surface shape of the semiconductor wafer 1, that is, the alignment mark 3 formed on the front surface of the semiconductor wafer 1 is seen. In some embodiments, it is preferable that the adhesive 11 and the supporting substrate 12 be transparent.

For example, a polyimide-based transparent adhesive, such as HD-3007 (trademark), may be used as the adhesive 11. It is preferable that the thickness of the adhesive 11 after the semiconductor wafer 1 and the supporting substrate 12 are bonded to each other by the adhesive 11 (hereinafter, simply referred to as the "thickness of the adhesive 11") be equal to or greater than 15 μm and equal to or less than 40 μm. The reason is as follows.

When the thickness of the adhesive 11 is less than 15 μm, it is difficult to planarize an uneven portion of the front surface structure 2 of the semiconductor wafer 1 with the adhesive 11 and a portion of the front surface structure 2 does not come into contact with the supporting substrate 12. Therefore, it is difficult to protect the front surface structure 2 with the adhesive 11. When the thickness of the adhesive 11 is greater than 40 μm, the front surface of the semiconductor wafer 1 is not seen. In addition, when the thickness of the adhesive 11 is greater than 40 μm, there is a concern that the semiconductor wafer 1 will be obliquely bonded to the supporting substrate 12. Therefore, it is preferable that the adhesive 11 have such a thickness that the front surface structure 2 can be protected and the front surface of the semiconductor wafer 1 can be seen through the adhesive 11.

As the supporting substrate 12, for example, the following may be used: a mineral (quartz) including silicon dioxide ($SiO_2$); heat-resistant glass, such as Pyrex (registered trademark) or Tempax (registered trademark); and a transparent silicon carbide (SiC) substrate. It is preferable that the thickness of the supporting substrate 12 be equal to or less than 5 mm. The reason is that, when the thickness of the supporting substrate 12 is equal to or greater than 5 mm, the front surface of the semiconductor wafer 1 is not seen through the supporting substrate 12.

In addition, it is preferable that the thickness of the supporting substrate 12 be equal to or less than 1 mm. The reason is as follows. When the thickness of the supporting substrate 12 is equal to or greater than 1 mm, there is a concern that the semiconductor wafer 1 will not be inserted into a generally used wafer cassette. Therefore, it is preferable that the thickness of the semiconductor wafer 1 including the thicknesses of the adhesive 11 and the supporting substrate 12 be sufficiently large to insert the semiconductor wafer 1 into the wafer cassette using a transport hand and to take out the semiconductor wafer 1 from the wafer cassette using the transport hand.

Then, the entire rear surface of the semiconductor wafer 1 is ground to reduce the thickness of the semiconductor wafer 1 (Step S3 and FIG. 2: a thinning process). Then, a resist (rear surface resist) 13 is applied onto the rear surface of the semiconductor wafer 1 (Step S4 and FIG. 3).

Then, a circuit pattern is formed in the rear surface resist 13 by patterning. In the patterning process, first, a camera 22 which is provided below a stage 21 of the exposure apparatus and a photomask 24 which is provided above the stage 21 are disposed at, for example, predetermined positions in the horizontal direction. Then, the semiconductor wafer 1 is mounted on the stage 21, with the front surface down (FIG. 4: a mounting process). Specifically, as described above, the semiconductor wafer 1 having the supporting substrate 12 attached thereto is taken out from the wafer cassette by, for example, the transport hand and is then mounted on the stage 21 such that the supporting substrate 12 comes into contact with the stage 21.

Then, the camera 22 is used to capture the image of the front surface of the semiconductor wafer 1 from the lower side of the stage 21 and the alignment mark 3 is detected on the basis of the captured image. That is, for example, the convex or concave alignment mark 3 which is formed on a scrub line is detected from the image captured by the camera 22. The exposure apparatus includes a positioning mechanism which moves the position of the semiconductor wafer 1 in the horizontal direction in, for example, the X-axis direction and the Y-axis direction and the positioning mechanism aligns the positions of the camera 22 and the semiconductor wafer 1 on the basis of the alignment marks 3 (positioning process). In this way, the positions of the semiconductor wafer 1 and the photomask 24 are accurately aligned with each other. Specifically, when the resist applied onto the rear surface of the semiconductor wafer 1 is patterned, the positioning mechanism moves the semiconductor wafer 1 in the horizontal direction such that patterning corresponding to the circuit pattern of the front surface structure 2 of the semiconductor wafer 1 is performed. Before the positioning process is performed, the position of the photomask 24 is fixed so as to be aligned with the position of the camera 22. Therefore, it is possible to accurately align the positions of the semiconductor wafer 1 and the photomask 24 by detecting the alignment mark 3 using the camera 22 and moving the semiconductor wafer 1 on the basis of the alignment mark 3.

Openings 23 are provided in the stage 21 at positions corresponding to the alignment marks 3 which are formed on the front surface of the semiconductor wafer 1. Therefore, the camera 22 observes, through the openings 23 of the stage 21, the front surface of the semiconductor wafer 1 which is seen through the supporting substrate 12 and the adhesive 11 and recognizes the alignment marks 3.

For example, a CCD (Charge Coupled Device) camera which mainly observes an object irradiated with visible light is used as the camera 22. For example, the camera 22 may observe the semiconductor wafer 1 with light in the room in which the exposure apparatus is installed or it may emit light from the supporting substrate 12 to the semiconductor wafer 1 to observe the semiconductor wafer 1.

Then, light (ultraviolet light) is emitted to the rear surface resist 13 formed on the rear surface of the semiconductor wafer 1 through the photomask 24 (exposure). Then, for example, the exposed portion of the rear surface resist 13 is dissolved by a solvent (development). In this way, the mask pattern of the photomask 24 is transferred to the rear surface resist 13. Then, the rear surface resist 13 is baked. In this way, the patterning process ends (Step S5 and FIG. 4: a second pattern forming process).

Openings 25 corresponding to the circuit pattern of the rear surface structure of the semiconductor wafer 1 are formed in the photomask 24. In the patterning process, light is emitted from a light source which is provided above the photomask 24 to the semiconductor wafer 1 through the photomask 24 by, for example, a unity-magnification projection method using various kinds of lenses. In this way, the circuit pattern of the rear surface structure of the semiconductor wafer 1 is transferred to the rear surface resist 13.

Then, ion implantation and thermal diffusion are performed using the rear surface resist 13 as a mask to form, for example, a rear surface structure (not illustrated) in which p collector regions and n collector regions are alternately formed in the rear surface layer of the semiconductor wafer 1 (Step S6). Then, the rear surface resist 13 is removed.

In the positioning process described above, the positions of the photomask 24 and the semiconductor wafer 1 are aligned with each other by the alignment marks 3 formed on the front surface of the semiconductor wafer 1. Therefore, in the process of Step S6, patterning corresponding to the front surface shape of the semiconductor wafer 1 is performed for the rear surface of the semiconductor wafer 1. That is, patterning corresponding to the circuit pattern of the front surface structure 2 of the semiconductor wafer 1 is performed for the rear surface of the semiconductor wafer 1. In Step S6, a concave portion which extends from the rear surface to the front surface of the semiconductor wafer 1 may be formed by etching.

Then, for example, a dicing tape is attached to the rear surface of the semiconductor wafer 1. Then, laser light is emitted from the supporting substrate 12 of the semiconductor wafer 1 to sublimate the adhesive 11 and the supporting substrate 12 peels off from the semiconductor wafer 1. The adhesive 11 may be dissolved by a solvent or the adhesive 11 may be softened by heat, according to a material forming the adhesive 11. Then, the semiconductor wafer 1 is diced into chips and the dicing tape peels off. In this way, a semiconductor device having the circuit patterns formed on the front and rear surfaces thereof is completed.

The supporting substrate 12 has chemical resistance and heat resistance. Therefore, since there is an adhesive residue or a carbonaceous residue on the supporting substrate 12 which peels off from the semiconductor wafer 1, the supporting substrate 12 can be reused after it is cleaned by, for example, an organic solvent.

In addition, for example, an infrared camera may be used instead of the CCD camera. In this case, a silicon (Si) substrate serving as a reinforcing member for the semiconductor wafer 1 may be used as the supporting substrate 12. The supporting substrate 12 which has been used and has low transparency may be reused.

Figure 5:
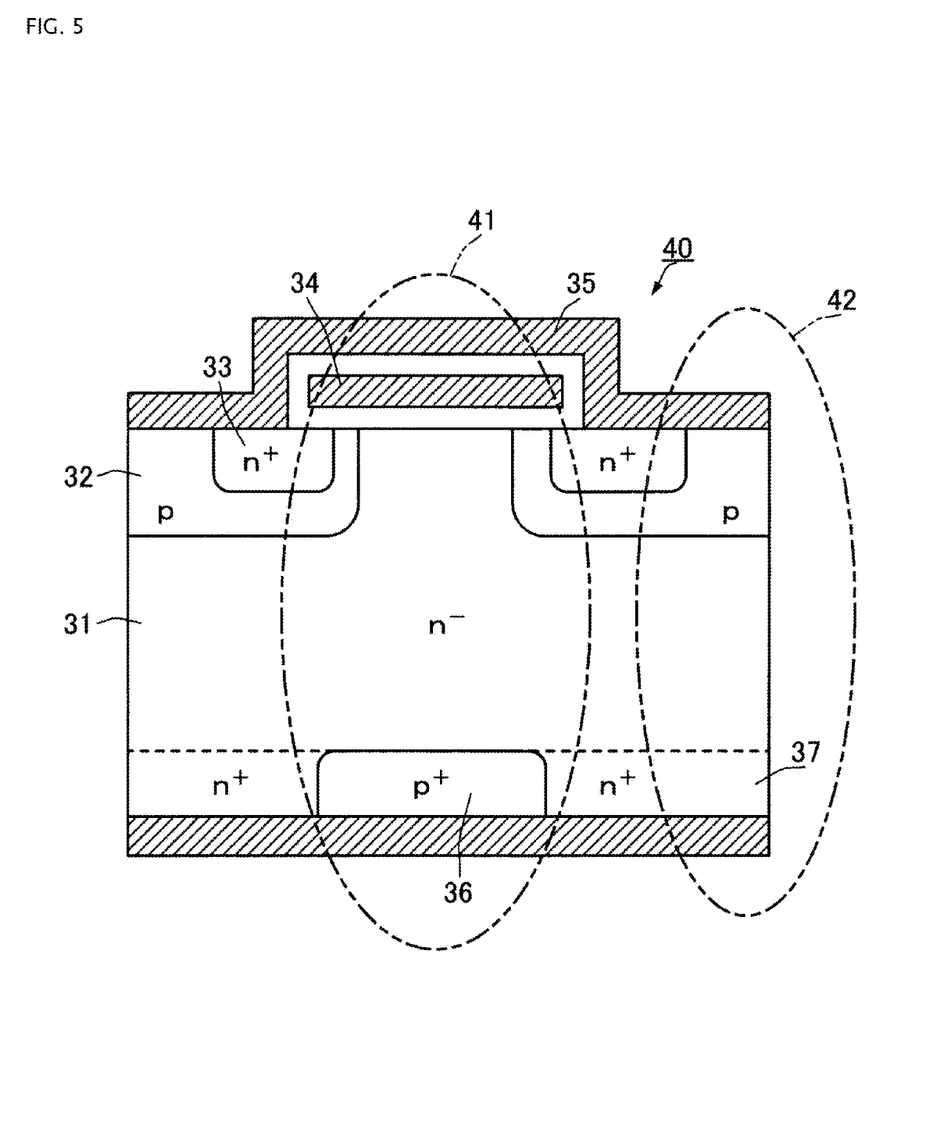
FIG. 5 is a cross-sectional view illustrating a main portion of the semiconductor device according to the embodiments.
Figure 6:
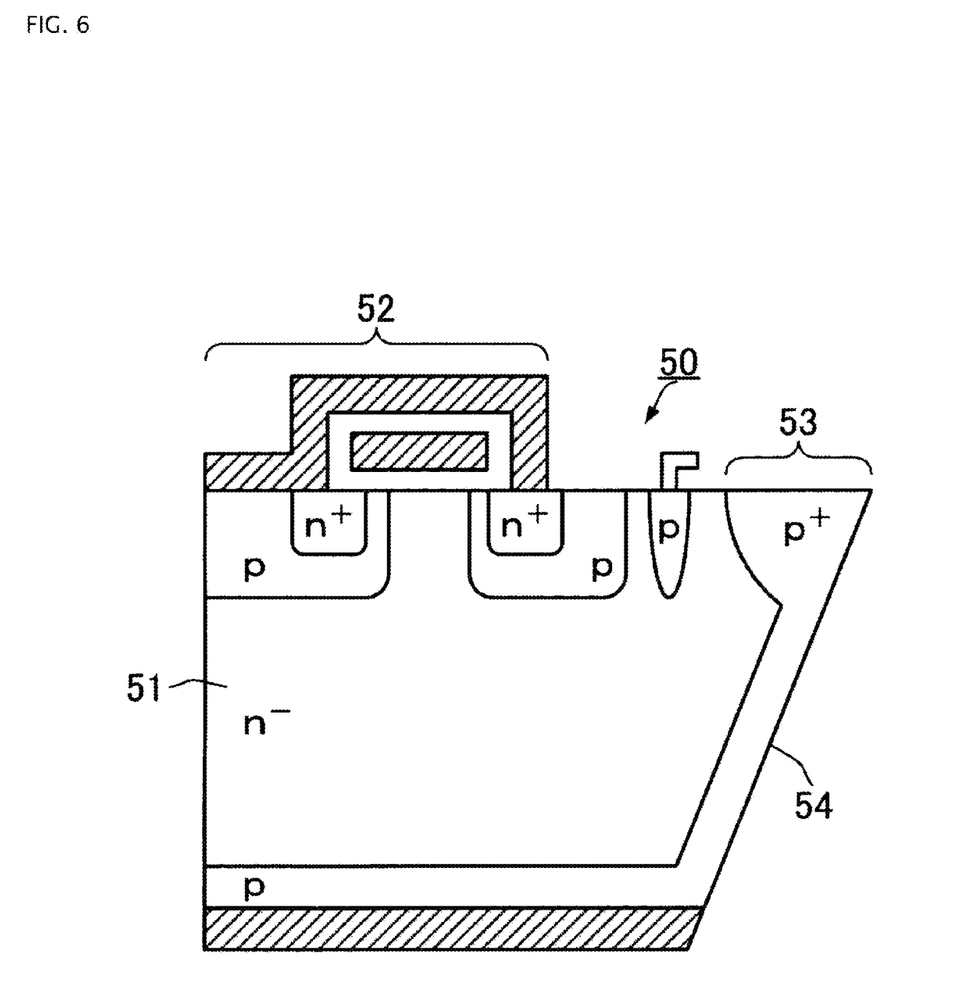
FIG. 6 is a cross-sectional view illustrating the main portion of the semiconductor device according to the embodiments.

FIGS. 5 and 6 are cross-sectional views illustrating a main portion of the semiconductor device according to the embodiment. For example, a reverse conducting IGBT (RC-IGBT) or a reverse blocking IGBT (RB-IGBT) can be manufactured by the semiconductor device manufacturing method according to the embodiment.

FIG. 5 is a cross-sectional view illustrating a main portion of an example of the RC-IGBT. As illustrated in FIG. 5, in an RC-IGBT 40, a front surface structure of a vertical IGBT including, for example, a p base region 32, an n$^+$emitter region 33, a gate electrode 34, and an emitter electrode 35 is formed as the front surface structure 2 on the front surface layer of a semiconductor wafer 31 which is an n⁻drift region. In addition, p⁺collector regions (first semiconductor regions) 36 and n⁺collector regions (second semiconductor regions) 37 are alternately formed in the rear surface layer of the semiconductor wafer 31.

Specifically, the p⁺collector region 36, which is the rear surface structure of the IGBT, is selectively formed in the rear surface of the semiconductor wafer 31 and an IGBT region 41 is formed on the semiconductor wafer 31. In addition, the n⁺collector region 37 is selectively formed so as to come into contact with the p⁺collector region 36 and a diode region 42 is formed on the semiconductor wafer 31 so as to be adjacent to the IGBT region 41.

That is, the RC-IGBT 40 in which the p⁺collector region 36 and the n⁺collector region 37 are provided in the rear surface layer of the semiconductor wafer 31 in a pattern corresponding to the front surface structure of the IGBT can be manufactured by the semiconductor device manufacturing method according to the above-described embodiment.

FIG. 6 is a cross-sectional view illustrating a main portion of the RB-IGBT. As illustrated in FIG. 6, in an RB-IGBT 50, a front surface structure of a vertical IGBT 52 and a p⁺region of a region (breakdown voltage structure region) 53 for maintaining a breakdown voltage are formed in the side of the front surface of a semiconductor wafer 51 which is an n⁻drift region. A p collector region of the IGBT 52 is formed in the rear surface of the semiconductor wafer 51. A concave portion 54 is formed in the breakdown voltage structure region 53 from the side of the rear surface, and the thickness of a portion of the semiconductor wafer 51 in which the breakdown voltage structure region 53 is formed is less than that of a portion of the semiconductor wafer 51 in which the IGBT 52 is formed. A space between the front surface structure of the IGBT 52 and the breakdown voltage structure region 53 is simply shown. However, in practice, a p-type guard ring region which is formed by diffusion and a plurality of ring-shaped field plates which come into contact with the guard ring region and extend to the inside or outside of the guard ring region are provided between the front surface structure of the IGBT 52 and the breakdown voltage structure region 53.

The p collector region of the IGBT 52 is connected to the p⁺region of the breakdown voltage structure region 53 by a p region which is formed on the sidewall of the concave portion 54. The concave portion 54 may extend from the rear surface to the front surface of the semiconductor wafer 51 or it may be formed with a depth to the p⁺region of the breakdown voltage structure region 53. That is, the RB-IGBT 50 in which the concave portion 54 is provided in the rear surface of the semiconductor wafer 51 in a pattern corresponding to the front surface structure can be manufactured by the semiconductor device manufacturing method according to the above-described embodiment.

In addition, a through hole which extends from the front surface to the rear surface of the semiconductor wafer may be formed so as to correspond to the circuit pattern of the front surface of the semiconductor wafer by the semiconductor device manufacturing method according to the above-described embodiment. In this way, for example, it is possible to manufacture a semiconductor device using a TSV (Through Silicon Via) technique which laminates and mounts a plurality of semiconductor wafers.

As described above, according to the embodiment, the supporting substrate 12 is attached to the front surface of the semiconductor wafer 1 by the adhesive 11. The adhesive 11 and the supporting substrate 12 have such transparency that the front surface of the semiconductor wafer 1 is seen. The term "such transparency that the front surface of the semiconductor wafer 1 is seen" means a transparency level at which the CCD camera can recognize the alignment mark 3 formed on the front surface of the semiconductor wafer 1 from the lower side of the stage 21. Therefore, it is possible to accurately recognize the alignment mark 3 formed on the front surface of the semiconductor wafer 1 from the lower side of the stage 21. In this way, it is possible to improve the positioning (alignment) accuracy of the semiconductor wafer 1. As a result, a patterning process corresponding to the circuit pattern of the front surface structure 2 of the semiconductor wafer 1 can be accurately performed for the rear surface of the semiconductor wafer 1. That is, it is possible to improve the accuracy of patterning.

When a general exposure apparatus is used, it is possible to reinforce the thinned semiconductor wafer 1 using the WSS technique. In this way, it is possible to prevent the breaking, cracking, or warping of the semiconductor wafer 1. Therefore, it is possible to increase the diameter of the semiconductor wafer 1 or further reduce the thickness of the semiconductor wafer 1. Since the thinned semiconductor wafer 1 can be reinforced by the WSS technique, it is not necessary to use the TAIKO technique for forming the rib portion at the outer circumferential end of the semiconductor wafer 1. Therefore, it is possible to solve the problems caused by the rib portion formed in the semiconductor wafer 1.

As described above, since a glass substrate, such as a quartz substrate, is used as the supporting substrate 12, it is possible to prevent the warping of the semiconductor wafer 1 during a process due to, for example, the metal electrode formed on the rear surface of the semiconductor wafer 1 and maintain the flatness of the semiconductor wafer 1.

Since the general exposure apparatus can be used, it is not necessary to use a special exposure apparatus (Conventional example 2: see FIG. 14) in which the infrared camera is provided above the stage. Therefore, it is possible to reduce manufacturing costs, as compared to the related art.

Before the mounting process, the semiconductor wafer 1 is reinforced by the supporting substrate 12. Therefore, even when the width of the opening 23 of the stage 21 is more than that in the related art, the flatness of the semiconductor wafer 1 is not damaged by the openings 23 of the stage 21. In this way, it is possible to increase the width of the opening 23 of the stage 21, as compared to the related art, and widen the observation range of the camera 22 through the opening 23. Therefore, the range in which the camera 22 can observe the surface of the semiconductor wafer 1 is widened and flexibility in the design of the circuit pattern is improved. In addition, when air in the opening 23 of the stage 21 is drawn to fix the semiconductor wafer 1, it is possible to stably fix the semiconductor wafer 1.

In the above-described embodiment of the invention, the method of forming the circuit pattern corresponding to the circuit pattern of the front surface structure in the rear surface of the semiconductor wafer has been described as an example. However, the invention is not limited to the above-described embodiment. For example, the invention can be applied to various processes of positioning the semiconductor wafer after the semiconductor wafer is mounted on the stage.

As described above, the semiconductor device manufacturing method according to the invention is useful for the manufacture of a power semiconductor device using the WSS technique which reinforces an integrated circuit or a MEMS with other members in order to reduce the thickness thereof.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

What is claimed is:

1. A method of manufacturing a semiconductor device, the method comprising:
    an attachment step of attaching a supporting substrate to the front surface of a semiconductor wafer using an adhesive, wherein
        the supporting substrate and the adhesive each have a transparency such that the front surface of the semiconductor wafer can be seen; and
        the thickness of the adhesive is equal to or greater than 15 μm and equal to or less than 40 μm;
    a patterning step of performing patterning, corresponding to a front surface shape of the semiconductor wafer, on a rear surface of the semiconductor wafer;
    a peeling step of peeling off the supporting substrate from the semiconductor wafer;
    a dicing step of, after the peeling step, dicing the semiconductor wafer into chips;.
    a mounting step of mounting the semiconductor on a stage, with the supporting substrate down, after the attachment step; and
    a positioning step of detecting a mark which is formed on the front surface of the semiconductor wafer and positions the semiconductor wafer from a lower side of the stage and positioning the semiconductor wafer,
    wherein, in the positioning step, the mark which is formed on the front surface of the semiconductor wafer and positions the semiconductor wafer is detected by a camera, and
    wherein, in the positioning step, the camera captures an image of the front surface of the semiconductor wafer through an opening which is provided in the stage from the lower side of the stage and the mark for positioning the semiconductor wafer is detected on the basis of the image captured by the camera.

2. The method of manufacturing a semiconductor device according to claim 1,
    wherein, in the positioning step, the mark which is formed on the front surface of the semiconductor wafer and positions the semiconductor wafer is detected through the supporting substrate and the adhesive.

3. The method of manufacturing a semiconductor device according to claim 1,
    wherein, after the positioning step, the patterning corresponding to the front surface shape of the semiconductor wafer is performed for the rear surface of the semiconductor wafer.

4. The method of manufacturing a semiconductor device according to claim 1, further comprising:
    a first pattern forming step of forming a circuit pattern in the front surface of the semiconductor wafer before the attachment step; and
    a second pattern forming step of performing patterning corresponding to the circuit pattern of the front surface of the semiconductor wafer for the rear surface of the semiconductor wafer after the positioning step.

5. The method of manufacturing a semiconductor device according to claim 4, further comprising:
    a thinning step of grinding the rear surface of the semiconductor wafer to reduce the thickness of the semiconductor wafer after the attachment step and before the second pattern forming step.

6. The method of manufacturing a semiconductor device according to claim 4,
    wherein, in the first pattern forming step, a circuit pattern of a front surface structure of an insulated gate bipolar transistor is formed in the front surface of the semiconductor wafer which is a first conduction type, and
    in the second pattern forming step, a second-conduction-type first semiconductor region and a first-conduction-type second semiconductor region are selectively formed in a surface layer of the rear surface of the semiconductor wafer so as to be adjacent to each other.

7. The method of manufacturing a semiconductor device according to claim 4,
    wherein, in the first pattern forming step, a circuit pattern of a front surface structure of an insulated gate bipolar transistor is formed in the front surface of the semiconductor wafer, and
    in the second pattern forming step, a concave portion is formed at an outer circumferential end of the semiconductor wafer from the rear surface of the semiconductor wafer.

8. The method of manufacturing a semiconductor device according to claim 1,
    wherein the adhesive has such transparency that the mark which is formed on the front surface of the semiconductor wafer and positions the semiconductor wafer is seen.

9. The method of manufacturing a semiconductor device according to claim 1,
    wherein the adhesive is transparent.

10. The method of manufacturing a semiconductor device according to claim 1,
    wherein the supporting substrate has such transparency that the mark which is formed on the front surface of the semiconductor wafer and positions the semiconductor wafer is seen.

11. The method of manufacturing a semiconductor device according to claim 1,
    wherein the supporting substrate is transparent.

12. The method of manufacturing a semiconductor device according to claim 1,
    wherein the thickness of the supporting substrate is equal to or less than 5 mm.

13. The method of manufacturing a semiconductor device according to claim 1,
    wherein the thickness of the supporting substrate is equal to or less than 1 mm.

* * * * *